(12) United States Patent
Beinat et al.

(10) Patent No.: US 6,375,747 B1
(45) Date of Patent: Apr. 23, 2002

(54) DISTRIBUTION MASK FOR DEPOSITING BY VACUUM EVAPORATION

(75) Inventors: Olivier Beinat, Bar-le-Duc; Dominique Conte, Saint Dizier, both of (FR)

(73) Assignee: Essilor International (Compagnie Generale d'Optique), Charenton le Pont (FR)

( * ) Notice: Subject to any disclaimer, the term of this patent is extended or adjusted under 35 U.S.C. 154(b) by 0 days.

(21) Appl. No.: 09/622,843
(22) PCT Filed: Feb. 23, 1999
(86) PCT No.: PCT/FR99/00405
 § 371 Date: Oct. 12, 2000
 § 102(e) Date: Oct. 12, 2000
(87) PCT Pub. No.: WO99/43863
 PCT Pub. Date: Sep. 2, 1999

(30) Foreign Application Priority Data
 Feb. 24, 1998 (FR) .............................................. 98 02177
(51) Int. Cl.⁷ .............................................. C23C 14/04
(52) U.S. Cl. ........................ 118/720; 118/721; 427/162; 427/164; 427/166; 427/248.1; 427/255.7; 427/282
(58) Field of Search ................................ 118/720, 721; 427/162, 164, 166, 248.1, 255.7, 282

(56) References Cited

U.S. PATENT DOCUMENTS

| 3,442,572 A | * | 5/1969 | Illsley et al. ................ 118/720 |
| 4,449,478 A | * | 5/1984 | Kraus .......................... 118/504 |
| 4,776,868 A | * | 10/1988 | Trotter et al. ................ 264/1.1 |

FOREIGN PATENT DOCUMENTS

| JP | 02 251143 | 10/1990 |
| WO | WO 92/07104 | 4/1992 |

OTHER PUBLICATIONS

"Uniformity Deposition Corrector." *IBM Technical Disclosure Bulletin*, vol. 14, No. 5, Oct. 1971, p. 1572.

* cited by examiner

*Primary Examiner*—Timothy Meeks
(74) *Attorney, Agent, or Firm*—Young & Thompson

(57) ABSTRACT

A distribution mask including at least two separate blanking panels (22), one of which is mounted mobile. The two blanking panels (22) are substantially coplanar, and, controlled by a common control unit (23), both mounted continuously mobile between two extreme positions, namely, a close position, and for which the space (E) between them is minimal, and a spaced position, for which the space (E) is on the contrary at its maximum. The invention is particularly applicable to antiglare treatment of ophthalmic lenses.

24 Claims, 2 Drawing Sheets

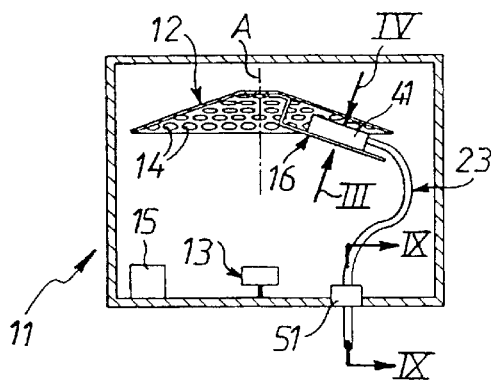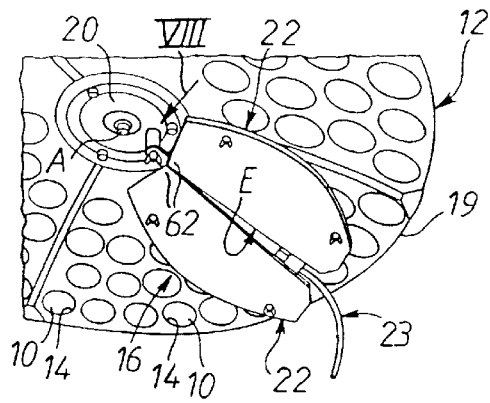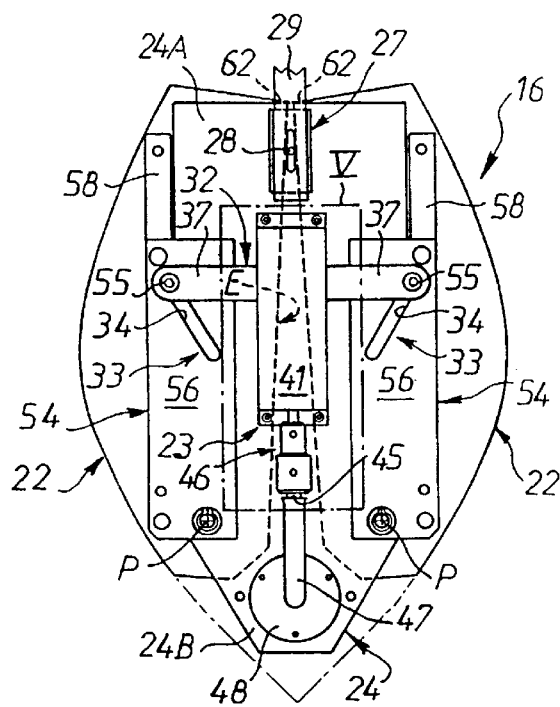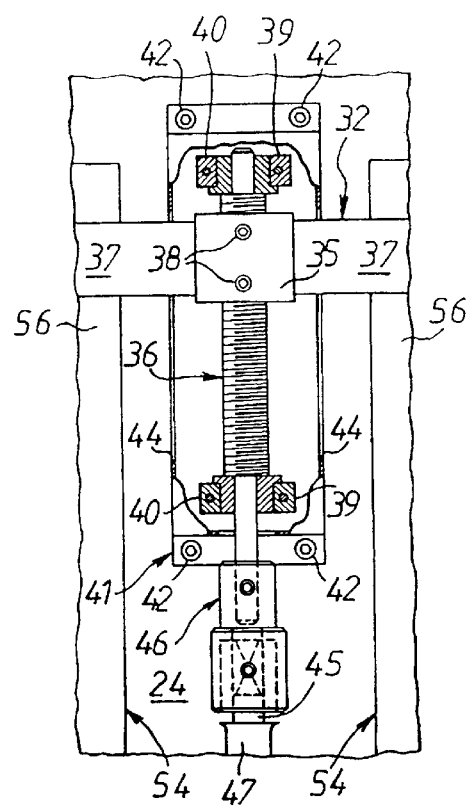

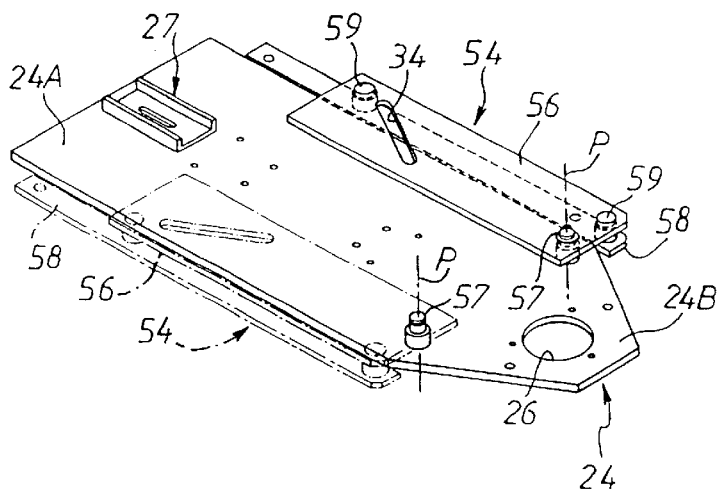
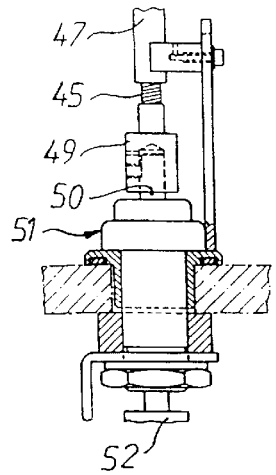
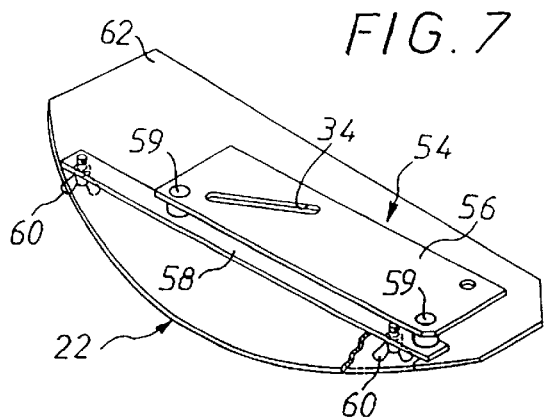
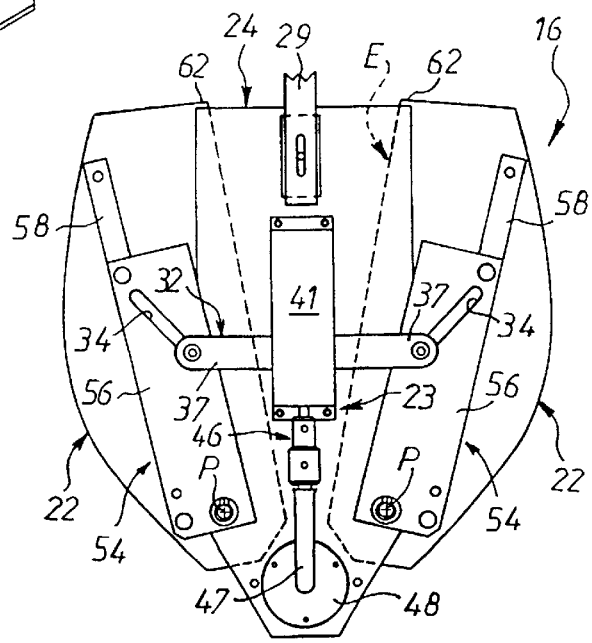
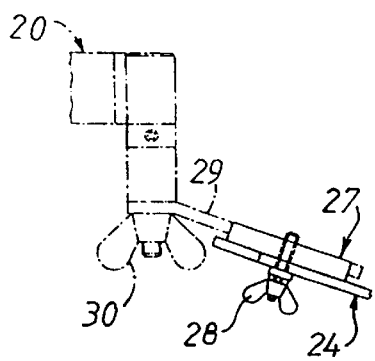

DISTRIBUTION MASK FOR DEPOSITING BY VACUUM EVAPORATION

FIELD OF THE INVENTION

Thee present invention is generally concerned with the deposition by evaporation of a coating of any kind onto a substrate of any kind.

It is more particularly, but not necessarily exclusively, directed to the situation in which the substrate is an ophthalmic lens.

BACKGROUND OF THE INVENTION

Whether they are made of mineral, organic or composite materials, we know that it is sometimes necessary to apply to ophthalmic lenses after manufacture a surface treatment to enhance certain characteristics of the lenses or to confer particular characteristics on them.

Examples of this are an anti-reflection treatment and/or a hardening treatment.

The present invention is even more particularly directed to the situation in which such treatment is effected by depositing a coating formed of at least one layer of material and where such deposition is effected by evaporation, to be more precise by evaporation in a vacuum.

The coating is usually a multilayer coating, i.e. a coating involving stacking a plurality of layers on top of each other.

The various layers can be of different materials, the same materials deposited with different thicknesses or the same materials deposited with the same thickness.

In the latter case, the layers are deposited with different evaporation parameters so that they have different physical-chemical properties.

For an anti-reflection treatment, for example, it is standard practice to stack at least six layers using four different materials, namely an attachment layer, four layers conferring the required optical effects, and a hydrophobic layer.

Usually a large number of substrates are treated at the same time and the treatment enclosure employed has a rotatable support inside it with a plurality of locations disposed around its rotation axis each adapted to receive a substrate to be treated, in practice in the general form of a spherical dome, and an emitter source from which the material to be deposited is evaporated.

In practice the emitter source is a support on which the material to be evaporated is placed, for example a crucible or a plate, and to evaporate it the material is heated by the Joule effect, by electron bombardment or by cathode sputtering, for example.

In all cases one problem to be overcome is that, for obvious reasons, the deposits must be uniform on each of the substrates and identical on all of them.

The evaporation cone of a material is in practice not isotropic.

It is not rare, in this case, to observe a difference between the thicknesses of the layers from one substrate to another, depending on the material deposited, the parameters conditioning its evaporation, the geometry of the treatment enclosure and the position of the emitter source within the treatment enclosure.

To minimise, if not eliminate, this difference, which can lead to unwanted disparities in characteristics, and in particular colour, between the substrates so treated, placing a mask with an appropriate configuration between the emitter source and the support carrying the various substrates to be treated is known per se.

This is described in U.S. Pat. Nos. 4,380,212 and 4,449,478, for example.

Determined experimentally, the configuration of the mask is such that its spread is greater near the rotation axis of the support than at a distance from that rotation axis, for example.

In this way a layer of material can be deposited on the various substrates treated with substantially the same thickness on all of them.

However, although the mask can in this way optimise the thickness of one layer, this is unfortunately not so for all the layers.

The single mask employed is then optimised for one of the layers and for the others, where this is technically possible, all that can be done is to operate on other parameters, to modify the shape of the corresponding evaporation cone, for example by subjecting the material to be evaporated to a pre-melt treatment of greater or lesser duration.

The distribution of the thin layers is usually more or less neglected, however.

Thus the overall result obtained is not always totally satisfactory, the various substrates treated at the same time having characteristics which are not strictly identical from one of them to another on leaving the treatment enclosure, depending on their position on the support.

Experiments have been carried out to improve on this situation.

For example, providing two different masks in the treatment enclosure, each individually adapted to depositing two different layers, and which are therefore used one at a time, has been proposed.

However, increasing the number of different masks in line with a greater number of layers to be deposited would quickly become prohibitive.

As in the document "Uniformity Deposition Corrector October 1971", IBM Technical Disclosure Bulltein, vol. 14, no. 5, October 1971, page 1572, XP002083820, forming the mask using a mobile covering panel has also been proposed.

However, as previously, the possibilities of adapting a mask of the above kind are limited to only two layers.

SUMMARY OF THE INVENTION

A general object of the present invention is an arrangement having an increased capacity for adaptation.

To be more precise, it firstly consists in a mask used to control the deposition by evaporation of a coating of any kind onto a substrate of any kind, the mask being of the kind including at least two separate covering panels one of which is mobile and generally being characterized in that the two covering panels, referred to hereinafter for convenience only as lateral covering panels, are substantially coplanar and, under the control of a common actuator, are mobile continuously between two extreme positions, namely a close together position in which the space between them is minimal and a spread apart position in which that space is maximal; it also consists in any treatment enclosure using a mask of the above kind and the process for obtaining a corresponding multilayer coating.

Using the invention, it is advantageously possible, for each layer to be deposited, to optimise the surface area of the mask by adjusting the surface area thereof as closely as possible.

All that is required is to move the two lateral covering panels of the mask a greater or lesser distance apart.

It is therefore possible to obtain substantially the same thickness for the layer deposited on each of the substrates treated at the same time and to obtain good uniformity of characteristics from layer to layer for all the substrates.

Hit and miss operation on other parameters, such as the pre-melt time, can advantageously be dispensed with.

In outline, the mask in accordance with the invention advantageously constitutes a variable surface area mask and, to form a multilayer coating, it is therefore advantageously possible to modify the surface area of the mask if necessary to deposit each of the layers

BRIEF DESCRIPTION OF THE DRAWINGS

The features and advantages of the invention will emerge from the following description given by way of example with reference to the accompanying diagrammatic drawings, in which:

FIG. 1 is a perspective view of a substrate to be treated;

FIG. 2 is an elevation view in section and to a smaller scale of a treatment enclosure which can be used to treat the substrate and in which a mask in accordance with the invention is used;

FIG. 3 is a perspective view of the mask to a larger scale, as seen from below and in the direction of the arrow III in FIG. 2, with part of the associated support;

FIG. 4 is a top view of the mask in accordance with the invention to a still larger scale and as seen in the direction of the arrow IV in FIG. 2, showing the 25 close together position of its two lateral covering panels;

FIG. 5 is a locally cut away view to a still larger scale of the detail V from FIG. 4;

FIG. 6 is a perspective view of the fixed base of the mask in accordance with the invention and of one of the levers by means of which the lateral covering panels are pivoted to the base;

FIG. 7 is a locally cut away perspective view of one of the lateral covering panels, with the lever that carries it;

FIG. 8 is a side view to a different scale and as seen in the direction of the arrow VIII in FIG. 3, showing the fixing of the mask in accordance with the invention to the attachment from which it is suspended;

FIG. 9 is a partial view of the actuator of the mask in section taken along the line IX—IX in FIG. 2 and to a different scale;

FIG. 10 is a plan view analogous to that of FIG. 4 showing the moved apart position of the lateral covering panels of the mask in accordance with the invention.

DETAILED DESCRIPTION OF THE INVENTION

The figures show, by way of example, the situation in which the substrate 10 to be treated is a circular contour blank adapted to constitute an ophthalmic lens after it is trimmed to shape.

The substrate 10 is to receive a treatment of any kind, for example an anti-reflection treatment, involving the deposition onto it by evaporation, to be more precise by evaporation in a vacuum, of a coating including at least one layer of a material of any kind.

As shown diagrammatically in FIG. 2, this is done in a treatment enclosure 11 containing a support 12 rotatable about an axis A and an emitter source 13 from which the material to be deposited is evaporated.

As shown here, for example, the support 12 is in the form of a spherical dome and its rotation axis A is coincident with its axis of symmetry and therefore passes through its central area.

Be this as it may, and as seen better in FIG. 3, the support 12 usually has a plurality of locations 14, in practice simply openings, each adapted to receive a substrate 10 to be treated, for example simply by nesting it therein.

The emitter source 13 can simply be a crucible which is disposed vertically below the support 12, on its rotation axis A, and in which the material to be evaporated is placed.

In the embodiment shown it is assumed that the material is evaporated by electron bombardment and the corresponding electron gun 15 is shown diagrammatically in FIG. 2.

In practice the coating to be obtained involves the successive deposition of a plurality of layers of material onto the substrate 10 and the materials employed can differ from one layer to the next.

The above arrangements are well known per se and as they are not inherently relevant to the present invention they will not be described in more detail here, in particular with regard to the means employed to support and to rotate the support 12.

A mask 16 is placed in the treatment enclosure 11, between the support 12 and the emitter source 13. This is also known per se.

The mask 16 is substantially parallel to and below the support 12.

As shown here, for example it extends globally radially over all of the active surface of the support 12, as far as its periphery 19.

In the embodiment shown, and as described in more detail hereinafter, the mask 16 extends cantilever fashion from a fixed attachment 20 around the rotation axis A of the support 12.

The mask 16 in accordance with the invention includes at least two separate covering panels 22, one of which is mobile. This is also known per se.

In accordance with the invention the two covering panels 22, referred to hereinafter for convenience only as lateral covering panels, are substantially coplanar and can be moved continuously relative to each other, by a common actuator 23 to be described in more detail hereinafter, between two extreme positions, namely a close together position in which, as shown in FIG. 4, the space E between them is minimal, and a far apart position in which, as shown in FIG. 10, the space E between them is maximal.

In the embodiment shown both lateral covering panels 22 are pivoted to a fixed base 24.

Their spaced pivot axes P are substantially parallel to each other and substantially perpendicular to the support 12.

The pivot axes P are indicated in FIGS. 4 and 10 and shown in chain-dotted line in FIG. 6.

In the embodiment shown the base 24 is in the general form of a plate.

It therefore forms a third covering panel, or middle covering panel, and the two lateral covering panels 22 are substantially parallel to it.

The pivot axes P of the lateral covering panels 22 are therefore substantially perpendicular to the base 24.

In the embodiment shown the base 24 has a rectangular front part 24A at the end nearer the rotation axis A of the support 12 and by which it is fixed to the fixed attachment 20 and a trapezoidal rear part 24B at the end nearer the periphery 19 of the support 12, in which there is a circular opening 26 for reasons that will become apparent hereinafter.

The pivot axes P of the lateral covering panels 22 are substantially at the junction between the front and rear parts 24A and 24B.

The front and rear parts 24A and 24B of the base 24 are of course continuous with each other.

For fixing it to the fixed attachment 20 the front part 24A has a slide 27 by means of which the assembly is adjustable in position, using a butterfly screw 28, on a lug 29 which is attached to the fixed attachment 20 by a butterfly screw 30, as shown diagrammatically in chain-dotted line in FIG. 8.

In the embodiment shown, the actuator 23 common to the two lateral covering panels 22 includes, on the same side as the top surface of the base 24, i.e. on the same side as the surface thereof facing towards the support 12, a swing-arm 32 which is mobile on the base 24 and which interengages with the lateral covering panels 22 through buttonhole arrangements 33 the buttonholes 34 of which are oblique to each other.

In practice the swing-arm 32 is parallel to the plane through the pivot axes P of the lateral covering panels 22.

The middle part of the swing-arm 32 is attached to a screwthreaded nut 35 meshing with a screwthreaded rod 36 rotating on the base 24, along the mid-line thereof.

As shown in FIGS. 4 and 5, for example, the swing-arm 32 has two arms 37, one for each of the lateral covering panels 22, and the two arms 37 extend back-to-back from the screwthreaded nut 35, to which they are appropriately fastened, for example by screws 38.

In the embodiment shown the screwthreaded rod 36 extends between two bearings 39 fastened to the base 24, for example by screws 40, and the assembly is protected by a cover 41 itself attached to the base 24, for example by screws 42, and which has lateral slots 44 for the arms 37 of the swing-arm 32.

In the embodiment shown the actuator 23 common to the two lateral covering panels 22 of the mask 16 in accordance with the invention is accessible from outside the treatment enclosure 11.

As shown here, for example, the screwthreaded rod 36 of the actuator 23 is constrained to rotate with a flexible drive 45 by a connector 46 and, protected by a sheath 47, the flexible drive 45 passes through the circular opening 26 in the rear part 24B of the base 24, an end-piece 48 attached to the base 24 in line with the circular opening 26 locating the assembly.

As shown in FIG. 9, the other end of the flexible drive 45 is coupled by another connector 49 to a rod 50 which exits the bottom portion of the treatment enclosure 11 through a rotary seal 51. On the outside of the treatment enclosure 11 it is engaged with a rotation actuator 52 of any kind.

The foregoing arrangements are not inherently relevant to the present invention and will therefore not be described in more detail here.

In the embodiment shown, each of the two lateral covering panels 22 of the mask 16 in accordance with the invention is removably attached to a support lever 54 which is pivoted to the base 24 and through which their common actuator 23 acts.

As shown here, for example, the buttonhole 34 of the buttonhole arrangement 33 whereby the swing-arm 32 of the actuator 23 interengages with a lateral covering panel 22 provides a localised opening in the support lever 54 to which the lateral covering panel 22 is attached and the swing-arm 32 carries a pin 55 in corresponding relationship to and engaged with moderate friction in the buttonhole 34 (see FIG. 4).

In the embodiment shown the support lever 54 of each of the two lateral covering panels 22 is at least in part on a first side of the base 24, to be more precise on the same side as its upper surface, to enable the actuator 23 to operate on it, and the corresponding lateral covering panel 22 is at least in part on the other side of the base 24, to be more precise on the same side as the lower surface thereof, i-e. on the same side as the surface of the base 24 facing away from the support 12.

As shown here, for example, the support lever 54 of each of the two lateral covering panels 22 includes, on the one hand, on the same side as the upper surface of the base 24, a flange 56 which incorporates the corresponding buttonhole 34 and which pivots on a pin 57 carried by the base 24 to materialise its pivot axis P and, on the other hand, on the same side as the lower surface of the base 24, a bar 58 which is suspended from the flange 56, to which it is coupled by two columns 59, and to which the lateral covering panel 22 concerned is attached by means of butterfly screws 60.

Thus it is advantageously possible to demount the lateral covering panels 22 after use to clean them, which makes them easier to clean.

It is therefore also possible to substitute for lateral covering panels 22 having a given configuration other lateral covering panels 22 having a different configuration, if required.

In the embodiment shown the identical lateral covering panels 22 have a globally rectangular contour in plan view but their outermost longitudinal edge is curvilinear, to be more precise convex.

Each therefore has a corner area 62 at the end of their innermost longitudinal edge opposite their pivot axis P.

Be this as it may, the mask 16 in accordance with the invention preferably has a plane of symmetry passing through the mid-line of its base 24, in practice extending in a radial direction of the support 12, and relative to which the two lateral covering panels 22 are mobile in opposite directions relative to each other.

In the embodiment shown, the pivot axis P of each of the lateral covering panels 22 is at a greater distance from the rotation axis A of the support 12 than the area in which their common actuator 23 acts on them, here the buttonhole arrangement 33 by means of which the swing-arm 32 of the actuator 23 interengages with their support lever 54.

In this embodiment, the buttonholes 34 of the two buttonhole arrangements 33 converge towards each other in the direction away from the rotation axis A of the support 12.

Finally, in the embodiment shown, the two lateral covering panels 22 are at least locally in contact with each other when they are in the close together position shown in FIG. 4.

As shown here, for example, when they are in the close together position they are in contact with each other only at a point, in a corner area, here their corner area 62, and the space E between them is globally triangular with the apex facing towards the rotation axis A of the support 12.

The swing-arm 32 of the actuator 23 then extends from the side of the front part of the screwthreaded rod 36, i.e. from the side thereof nearer the rotation axis A of the support 12.

When the actuator 23 is operated the swing-arm 32 moves parallel to itself along the screwthreaded rod 36 and causes the two lateral covering panels 22 to move progressively apart.

The two lateral covering panels 22 are therefore deployed laterally, on respective opposite sides of the base 24, just as if their spread were progressively increased at the same end as the rotation axis A of the support 12.

At the end of its travel the swing-arm 32 is at the same end as the rear part of the screwthreaded rod 36, i.e. the end of the latter at the greater distance from the rotation axis A of the support 12, and the two lateral covering panels 22 are therefore in their spread apart position shown in FIG. 10.

The space E between them then has a globally triangular contour in plan view, but the apex of that contour is then at the end opposite the rotation axis A of the support 12.

Obviously, because of the actuator 23, the two lateral covering panels 22 can occupy continuously any intermediate position between their close together position and their spread apart position.

It follows from the foregoing description that, to form a multilayer coating to treat a set of substrates 10 the invention uses, inside the corresponding vacuum evaporation treatment enclosure 11, a variable surface area mask 16, for example of the type described hereinabove, and the surface are of the mask 16 is modified for depositing at least one of the layers, for example as required to deposit each of them.

When the substrates 10 treated are ophthalmic lenses, for example, the coating deposited comprises layers such that the resulting treatment of the substrate 10 is an anti-reflection treatment.

The coating includes at least two layers of different materials, for example.

If required, the substrates 10 are heated before depositing the coating.

If required, they undergo ionic bombardment before depositing the coating, the intensity of the ionic bombardment being adjusted by modifying the surface area of the mask 16, for example.

Likewise, the deposition of the coating can be assisted by ionic bombardment, if required.

The present invention is not limited to the embodiment described and shown, but encompasses any variant execution thereof.

What is more, its field of application extends to any vacuum evaporation technique and in particular the magnetron target technique in which the problem of the uniformity of the layers is even more critical because the substrates to be treated are disposed near the material or materials to be evaporated.

It is sufficient to adapt the shape of the mask accordingly, if necessary.

What is claimed is:

1. Mask used to control the deposition by evaporation of a coating of any kind onto a substrate of any kind, the mask including at least two lateral covering pane (22), at least one of said lateral covering panels being mobile, said lateral covering panels being substantially coplanar and being pivoted to a base (24) forming a fixed third covering panel in order to pivot, under the control of a common actuator (23), continuously between two extreme positions, namely a close together position in which the space (E) between said lateral covering panels (22) is minimal and a spread apart position in which that space (E) is maximal.

2. The mask according to claim 1 characterized in that the actuator (23) common to the two lateral covering panels (22) includes a swing-arm (32) mobile on the base (24) and interengaging with the lateral covering panels (22) through buttonhole arrangements (33) the button-holes (34) of which are globally oblique to each other.

3. The mask according to claim 2 characterized in that the middle part of the swing-arm (32) is fastened to a screwthreaded nut (35) which is interengaged with a screwthreaded rod (36) rotatably mounted on the base (24).

4. The mask according to claim 2 characterized in that each of the two lateral covering panels (22) is removably attached to a support lever (54) which is pivoted to the base (24) and through which their common actuator (23) operates.

5. The mask according to claim 4, characterized in that the buttonhole (34) of the buttonhole arrangement (33) by which the swing-arm (32) is interengaged with a lateral covering panel (22) forms a localized opening in the support lever (54) to which that lateral covering panel (22) is attached and the swing-arm (32) carries in corresponding relation thereto a pin (55) which is engaged in that buttonhole (34).

6. The mask according to claim 4, characterized in that the support lever (54) of each of the two lateral covering panels (22) extends at least in part from a first side of the base (24) and the corresponding lateral covering panel (22) extends at least partly from the other side of said base (24).

7. Treatment enclosure for deposition by evaporation of a coating on a substrate, having inside it a rotatable support (12) having a plurality of locations (14) each adapted to receive a substrate (10) to be treated, an emitter source (13) from which the material to be deposited is evaporated, and a mask (16) operative between the support (12) and the emitter source (13), characterized in that the mask (16) is a mask according to claim 2.

8. The treatment enclosure according to claims 7, characterized in that the mask (16) is substantially parallel to the support (12).

9. The treatment enclosure according to claim 8, characterized in that the pivot axis (P) of each of its lateral covering panels (22) is at a greater distance from the rotation axis (A) of the support (12) than the area in which their common actuator (23) acts on them.

10. The treatment enclosure according to claim 3, characterized in that the mask (16) extends cantilever fashion from a fixed attachment (20) around the rotation axis (A) of the support (12).

11. The treatment enclosure according to claim 7, characterized in that the actuator (23) common to the two lateral covering panels (22) of the mask (16) is accessible from the outside.

12. The mask according to claim 11, characterized in that the two lateral covering panels (22) are substantially parallel to the base (24).

13. The mask according to claim 12, characterized in that, in their close together position, the two lateral covering panels (22) are at least locally in contact with each other.

14. The mask according to claim 13, characterized in that, in their close together position, the two lateral covering panels (22) are in contact with each other only at a point, in a corner area (62), and the space (E) between them then has a globally triangular contour in plane view.

15. The mask according to claim 1, characterized in that it has a plane of symmetry relative to which the two lateral covering panels (22) are mobile relative to each other in opposite directions.

16. Process of producing a multilayer coating for treating a set of substrates (10) by evaporation in a vacuum, of the kind in which the substrates (10) are disposed in a vacuum evaporation treatment enclosure (11) containing a mask (16), characterized in that the mask (16) is a variable surface area mask according to claim 1, and the surface area of the mask (16) is modified to deposit each of the layers.

17. The process according to claim 16, characterized in that the coating comprises layers such that the resulting treatment of the substrates (10) is an anti-reflection treatment.

18. The process according to claim 16, characterized in that the coating comprises at least two layers of different materials.

19. The process according to claim 16, characterized in that the substrates (10) are heated before depositing the coating.

20. The process according to claim 16, characterized in that the substrates (10) undergo ionic bombardment before depositing the coating.

21. The process according to claim 20, characterized in that the intensity of the ionic bombardment is adjusted by modifying the surface area of the mask (16).

22. The process according to claim 16, characterized in that the deposition of the coating is assisted by ionic bombardment.

23. The process according to claim 16, characterized in that the two covering panels (22) are mobile.

24. The process according to claim 16, characterized in that the substances (10) treated are ophthalmic lenses.

* * * * *